US005761664A

United States Patent [19]
Sayah et al.

[11] Patent Number: 5,761,664
[45] Date of Patent: Jun. 2, 1998

[54] HIERARCHICAL DATA MODEL FOR DESIGN AUTOMATION

[75] Inventors: John Sayah; Vinod Narayanan, both of Fishkill; Philip Honsinger, Poughkeepsie, all of N.Y.

[73] Assignee: International Business Machines Corporation, Armonk, N.Y.

[21] Appl. No.: 75,241

[22] Filed: Jun. 11, 1993

[51] Int. Cl.$^6$ .................................................. G06F 17/30
[52] U.S. Cl. ................ 707/100; 364/283.2; 364/DIG. 1
[58] Field of Search .................................. 395/800, 600, 395/160, 161; 707/100; 364/283.2, DIG. 1

[56] References Cited

U.S. PATENT DOCUMENTS

| 4,295,149 | 10/1981 | Balyoz et al. | 257/211 |
|---|---|---|---|
| 4,612,618 | 9/1986 | Pryor et al. | 364/490 |
| 4,688,072 | 8/1987 | Heath et al. | 257/202 |
| 4,780,617 | 10/1988 | Umatate et al. | 250/548 |
| 4,837,447 | 6/1989 | Pierce et al. | 250/492.2 |
| 4,890,238 | 12/1989 | Klein et al. | 364/491 |
| 4,918,614 | 4/1990 | Modarres et al. | 364/490 |
| 4,978,633 | 12/1990 | Seefeldt et al. | 437/51 |
| 5,019,961 | 5/1991 | Addesso et al. | 364/192 |
| 5,111,413 | 5/1992 | Lazansky et al. | 364/578 |
| 5,182,797 | 1/1993 | Liang et al. | 393/160 |

OTHER PUBLICATIONS

Hanan Samet, "Hierarchical Representations of Collections of Small Rectangles"; ACM Computing Surveys, vol. 20, No. 4, Dec. 1988, pp. 271–309.

P–Y Hsiao et al., "New Algorithms Based on a Multiple Storage Quadtree for Hierarchical Compaction of VLSI Mask Layout"; Butterworth & Co., pp. 74–80. Mar. 1990.

George S. Taylor et al., "Magic's Incremental Design–Rule Checker"; 21st Design Automation Conference, Paper 11.2, Electrical Engineering & Computer Sciences Dept., University of California, Berkeley, pp. 160–165. 1984.

Jonathan B. Rosenberg, "Geographical Data Structures Compared: A Study of Data Structures Supporting Region Queries"; IEEE Transactions on Computer–Aided Design, vol. CAD–4, No. 1, Jan. 1985, pp. 53–67.

Adam D. Sherer et al., "SMALS: A Novel Database for Two–Dimensional Object Location"; IEEE Transactions on Computer–Aided Design, vol. 9, No. 1, Jan. 1990, pp. 57–65.

Randy Lee Brown, "Multiple Storage Quad Trees: A Simpler Faster Alternative to Bisector List Quad Trees"; IEEE Transactions on Computer–Aided Design, vol. CAD–5, No. 3, Jul. 1986, pp. 413–419.

Primary Examiner—Alyssa H. Bowler
Assistant Examiner—John E. Harrity
Attorney, Agent, or Firm—Whitham, Curtis & Whitham; Aziz M. Ahsan

[57] ABSTRACT

A computer model for facilitating computer assisted design includes data structures which are flexibly organized by storing of information in accordance with entities or simulations thereof (including symbolic layer entities, area entities, area spec entities and area spec usage pattern entities), which are hierarchically associated both by relationships between them at a given level of abstraction of the physical entity they represent and by various attributes that correspond to different levels of abstraction in graphs. The graphs are freely mappable onto any desired fixed data structure such as a hierarchical area tree. Each hierarchical level and particularly the symbolic layer entity within the computer model provides data hiding at each lower level thereof and thus provides data hiding in the fixed data structure by virtue of the mapping function in order to reduce data processing overhead for manipulation of the fixed data structure. Further spatial restriction within one or more symbolic layers is provided by means of an applications window entity. Data compaction is provided by provision of data sharing of area spec entities by plural area entities which are otherwise uniquely maintained.

14 Claims, 8 Drawing Sheets

(did not expand down to areas 21-24)

HIERARCHICAL DATA MODEL FOR DESIGN AUTOMATION

BACKGROUND OF THE INVENTION

1. Field of the Invention

The present invention generally relates to an enhancement for computer assisted design and, more particularly, to a data model for facilitating data processing incident thereto, especially as related to semiconductor integrated circuit layout design.

2. Description of the Prior Art

Computer assisted design (CAD) is generally well-known and relatively well-developed. Numerous CAD applications are currently available for general drafting, architectural, and other applications. Due to the many critical design constraints which must be observed, which may be generally referred to as design rules, in the often highly repetitive nature of integrated circuit designs, CAD applications have been used for a number of years for design of mask or pattern layout for manufacture of semiconductor devices and especially integrated circuits having a high density of integration. By the same token such CAD applications operate at far less than optimum levels due to the large number of data necessary to represent design rules and other criteria with a desired degree of accuracy. For example, on small computers, additional math co-processing apparatus must generally be provided in order to obtain satisfactory execution speeds. Further, a large number of data are necessary to represent repeated patterns or patterns which are substantially repeated but modified to a greater or lesser extent in particular iterations of the pattern.

It is also common to generate a full bit map of the repeated patterns and to accumulate therefrom a full bit map of the design as it is completed. In this regard, it is also known to provide for aggregation of elemental patterns (e.g. transistors into gates, gates into gate arrays, etc.) for operational simplicity. However, this is only done at the expense of greater computational complexity since the aggregated patterns will require far more data to express, particularly as a bit map, than the sum of the elemental patterns included therein. This is true since, as more structure is handled together, the number of constraints on further design work which can be permitted under the design rules and the constraints imposed by the circuit elements and the devices represented by the aggregated patterns increases greatly as areas are aggregated.

It is also recognized in the data processing arts that operation of an application program can often be enhanced by the data structure employed to hold data upon which the application program will operate. For example, when a search of data is required, tree structures will increase search speed since, if properly managed and rebalanced from time-to-time, a tree structure will permit at least half of the data remaining to be searched to be ignored subsequent to each search path decision. However, during computer assisted design of integrated circuits, in particular, the amount of data which is generated and the number of operations to be performed thereon is sufficient to significantly slow the response time of the data processing apparatus even if such known data structures are optimally used because the management of the data structure, itself, requires a significant amount of computational overhead. Further, no single data structure is optimum for all applications or even all parts of a single application. Therefore, the constraints imposed by the data structure and the modelling of the physical structure being designed can be considered to be a major impediment to the operational efficiency of computer assisted design applications.

Of course, techniques are known for manipulating data structures such as for rebalancing of tree structures and for rearranging data in one data structure into another data structure. That is, flat (e.g. all image points represented without regard to relative position), segmented or slotted (e.g. where restrictions are placed on locations of sub-patterns) and the like can be freely translated to other data structures such as tree structures within the present state of the art but only at the cost of substantial computing overhead. Running such translation programs in the foreground or even under general control of a design program does not engender efficiency when a large amount of data is involved. A substantial loss of efficiency accrues as increasing amounts of data are generated during the design process, particularly in the case of integrated circuit design. This can be appreciated by observing that the benefit of tree structures is that they allow substantial amounts of data to be ignored during a search of that data. Manipulating each piece of data in the data base or even a significant fraction thereof to allow an efficient search clearly would require more data processing time than is saved by an optimally efficient search. Accordingly there is a long-felt need for data modelling which maintains efficiency of access to data during computer assisted design processing.

SUMMARY OF THE INVENTION

It is therefore an object of the present invention to provide a method and apparatus for modelling of a physical structure being designed which provides transparency of the data structure and allows manipulation of a data structure independently of an application accessing the data structure.

It is another object of the invention to provide a method and apparatus for modelling a physical structure being designed which masks data which is not necessary to a particular operation of the application being executed.

It is a further object of the invention to provide a method and apparatus for modelling a physical structure being designed which reduces the amount of data to be searched as design data is accumulated.

It is another further object of the invention to provide a method and apparatus for modelling a physical structure being designed which allows each application or portion of an application to have its own view (e.g. organization) of the data structure containing data to be operated upon.

In order to achieve the above and other objects of the present invention, an information model is provided comprising a first data structure containing, at respective nodes, descriptions of physical or abstracted physical attributes of a spatially partitioned physical structure partitioned hierarchically, a second data structure containing, at respective nodes, a nested, compacted, representation of the structural representation of each hierarchical partition of the physical or abstracted physical attributes and specifications of each hierarchical partition of said physical or abstracted physical attributes, and an interface for encapsulating the first and second data structures from inquiring applications, each node of the first data structure mapping to a node of the second data structure and each node of the second data structure mapping to at least one node at a single hierarchical level of the first data structure.

In accordance with another aspect of the invention, a method of performing an operation on data representing physical or abstracted physical attributes of an object is provided, including the steps of specifying data in a first data structure in a hierarchical form, storing specification data in nodes of a second data structure which is hierarchically partitioned, the specification data at a node of the second data structure corresponding to the data stored in at least one node at a single hierarchical level of the first data structure, mapping nodes of the first data structure to nodes of the second data structure, and forming an encapsulating layer which interfaces with the first and second data structures for accessing, interrogating and altering the first and second data structures.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
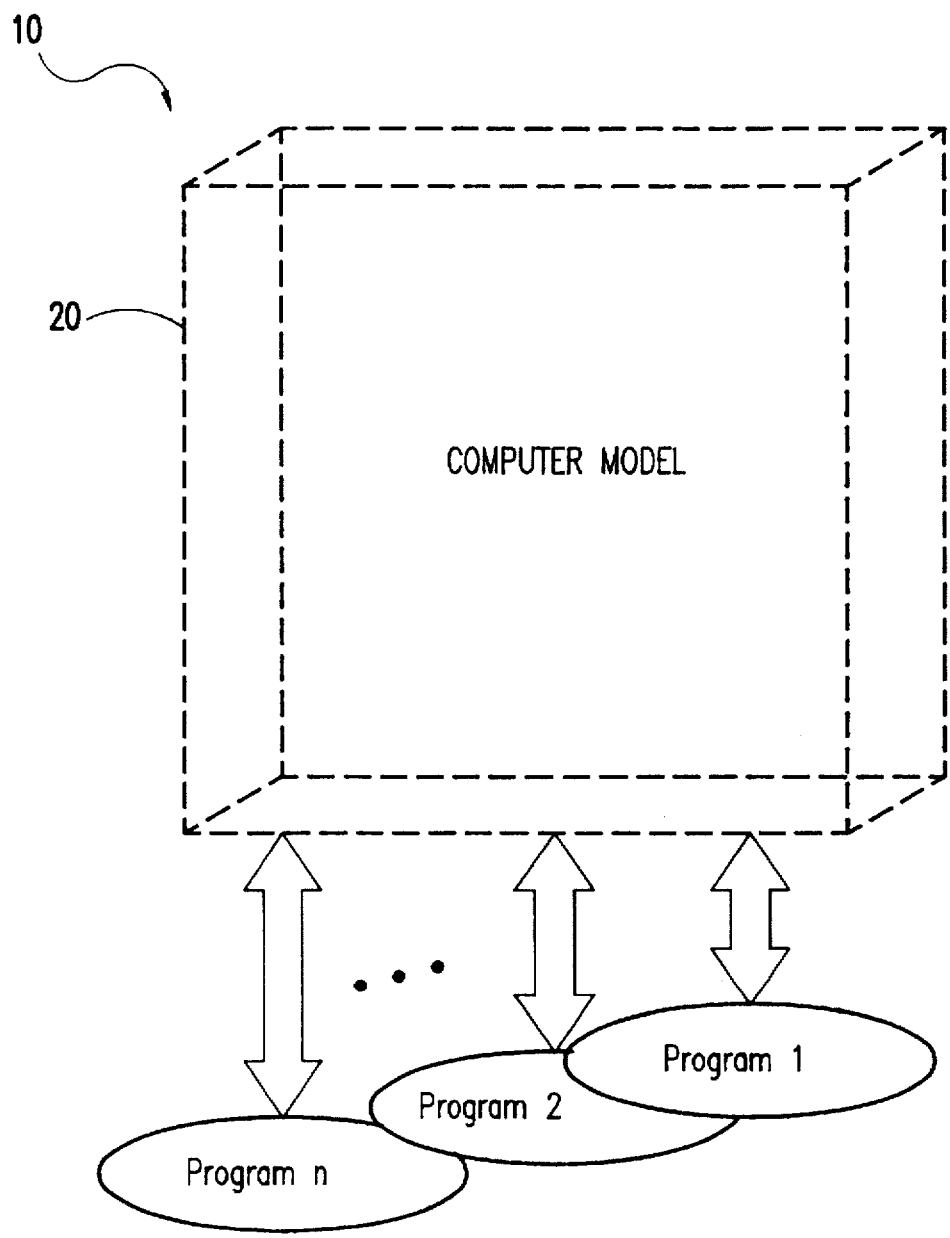
FIG. 1 is an overall operational diagram of a computer assisted design application.

Referring now to the drawings, and more particularly to FIG. 1, there is shown a symbolic organization 10 of a database including a computer model 20, which is a representation of a segment of the real world for purposes of interaction with and manipulation by one or more computer programs. Such a computer model can be made up of descriptions of components and the relationships between them; the collection of components and relationships, in its entirety constituting the model. A plurality of programs or applications may be used singly or in combination to manipulate information in the database in the course of computer assisted design to create and refine the model. The database may contain information which is known from previous design experience with similar technology or component elements which may be used in the course of design of the structure represented by the computer model 20. It is to be understood that FIG. 1 is representative of the interaction of the computer model 20 of the present invention with a plurality of applications and in which compatibility as well as high performance is achieved by virtue of the invention.

With prior art database computer models each application must separately interact with a substantially static data structure containing a very large volume of data, much of which may be irrelevant to a particular application. The data structure is provided as a mechanism for expediting search of and access to this volume of data and thus is rigidly organized. Known hierarchical data structures, such as trees, must be highly regular, such as in well-known quadtrees and octrees which have four and eight branches, respectively, from each node. Due to this organization, many characteristics which may be common to numerous nodes usually must be separately stored because of a single or small number of differing characteristics, thus increasing the data volume which must be searched and accessed. Further, the organization of data (e.g. the order in which differing characteristics are represented by branching levels) in the computer model is likely to be a compromise in anticipation of the particular applications which will access the data and the computer model will seldom be optimized for any single application. Therefore, even if the applications, Program 1—Program n, are compatible with the computer model, high levels of performance may not be achievable in view of the large amount of data the applications must search in prior art computer model data structures, the order in which search criteria are applied in view of the organizational hierarchy of the data structure (e.g. tree) or the computer overhead involved in management of the prior art data structures. In addition, while accessing data through a data structure, is likely to have accessed, and thus must manage, far more data than is being manipulated at any given point in the operation of the application.

Figure 2:
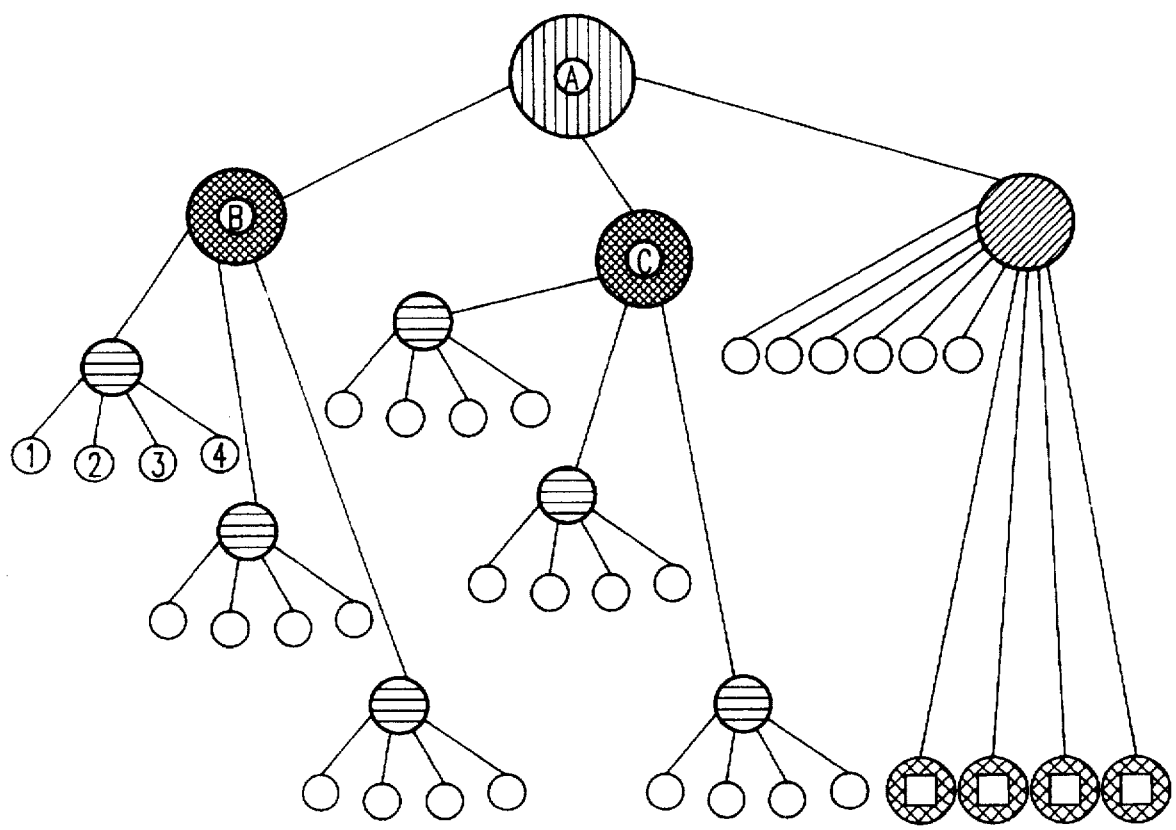
FIG. 2 is a generalized depiction of a tree data structure.

For example, a generalized tree structure 220 is shown in FIG. 2, in which node A represents the overall design. Lower level nodes such as B, C, etc. will represent an increasing level of detail, such as differentiated areas or shapes on a chip or differentiated characteristics thereof. This hierarchy is repeated at further nodes until the most full expression of detail is reached at so-called leaf nodes such as are indicated at nodes 1, 2, 3 and 4. This rigid structure imposes the requirement that each node must contain all the constraints imposed by the information at lower levels of the tree. The information contained in a particular node is unique to that node and cannot be shared. Also, for efficient searching and management of such a data structure, it is desirable to have regularity in the number of branches which emanate from each node; four branches from each node predominating in FIG. 2. This type of division (e.g. quadrisection) is commonly applied to flat computer models by subdivision of each area into four sub-areas and repeating the process until the desired granularity is reached, to result in a so-called hierarchical area tree. However, when this type of subdivision is done, based either on area or some other criterion, each level of the hierarchy commonly contains all the information of all lower levels in order, for example, to test for compliance with design rules. It can therefore be readily appreciated that such a rigid structure may not be optimally matched to either a particular design or a particular application for processing the data from which the computer model is developed. More importantly, such a fixed tree structure precludes optimization for any particular application or group of applications which may operate on data in respect of certain ones or groups of properties and not others. Thus it is characteristic of such data structures that far more data will be available than is necessary for processing by any particular application for manipulation of the data.

In addition to the data processing difficulty in dealing with excess information, alluded to above, another serious practical limitation on the ease of use and the requirements of designers is imposed by fixed data structures. That is, the contents of the data structure must be largely complete before any meaningful degree of design evaluation can be done. As a practical matter, this means that the underlying technology must be more or less fully defined. Such a definition of the technology is often not available in the early stages of design. Therefore, analysis cannot usually be made in order to obtain a rough definition of the technology which will be required. Conversely, it is difficult to use rough definitions of a proposed technology in a flat or bitmap type of image model. Therefore, the definition of the model cannot be readily refined as the design progresses.

With specific reference to integrated circuit design, for example, to which the invention should not be considered to be limited, computer models are typically referred to as images of layers of which the device is composed and which are conventionally represented in a flat form in the nature of a bit map. Each coordinate of interest is represented by a group of bits and each layer of the device is represented by a two-dimensional array of such groups of bits. The invention, however, models such data in a hierarchical form having constructs for representing the characteristics of different areas in a compact form. One practical advantage of this approach is that areas can be subdivided in a hierarchical manner based on the technology which underlies the chip or package being designed.

To this end, the hierarchical computer model in accordance with the invention is based on entities, relationships and attributes (EAR). The actual pattern portions of layers or areas, for example, are represented by nodes of the hierarchical computer model which, for clarity and distinction from nodes of a fixed data structure also employed in the invention, are referred to as entities. It is also preferred to provide, as an entity, a definition or specification of characteristics of certain types of areas in the image which will hereinafter be referred to as an "area spec" or "area spec entity". Area spec entities are used to facilitate data sharing since the characteristics of every area in an image is defined by an area spec entity although there will seldom be a one-to-one correspondence between areas and area specs (as would only occur when every elemental area was unique in most, if not all, characteristics).

Additionally, two other forms of entities are preferably provided. First, in order to limit the region of consideration by a user and to similarly truncate the data which must be handled by the processor, an application window is preferably provided. This application window is, itself, a user-defined area of the image and will contain one or more areas and one or more area specs corresponding thereto. Second, while all electronic integrated circuit packages are made up of physical layers (and many other physical objects can be similarly described), it must be remembered that the resulting device is three-dimensional. Therefore, some layers, such as via patterns and other interconnect structures, may not be single physical layers but may be conveniently represented as such. Therefore, such representations are preferably provided and referred to as symbolic layers.

Conversely, symbolic layers are often a combination of physical layers. For example, a so-called placement layer may actually be composed of two semiconductor layers and a metal layer but more conveniently represented as a single, aggregate layer. Such a placement layer also serves as an abstraction of "legal" placement location targets for component placement, independent of the underlying implementation. Another example is a wiring layer which represents all constraints and structures necessary for interconnections on a particular part of a chip. Symbolic layers may also be aggregated in the same manner as physical layers may be aggregated; the resulting representation combining the features of plural symbolic layers into a single so-called physical design layer. An example of such physical design layers would be a multi-layer wiring layer such as a global wiring layer. Thus, by provision of symbolic layers, all information pertinent to a particular aspect of the design may be encapsulated into one concise structure. Perhaps more importantly, this form of modelling also allows the symbolic layers to be application specific even when a plurality of physical layers is involved.

The interaction between different entities are represented by relationships. The characteristics of each entity are represented by attributes. For example, in an integrated circuit including a number of circuits placed on a chip, each circuit will be represented by an entity (at a given level of abstraction), the fact that the circuit resides on a chip is a relationship and the size of the chip or the circuit will be an attribute. At another level of abstraction, for example, at the device level, the device is represented by an entity, the connections from the device to surrounding pattern portions are represented by relationships and the underlying technology is represented by an attribute. As devices are grouped together in the formation of the overall model, then, it is seen that each grouping can be represented as an entity with relationships defining the relationships to other entities and attributes defining the characteristics of the entity. Thus, it should be observed that the relationships point upwards in the tree to entities comprised of larger groupings while attributes of each entity comprises the aggregate properties of the constituents of the entity, such as design rules, and serve to summarize and thus hide the specifics of the constituents which are, themselves, represented by entities nested at lower hierarchical levels.

Figure 3:
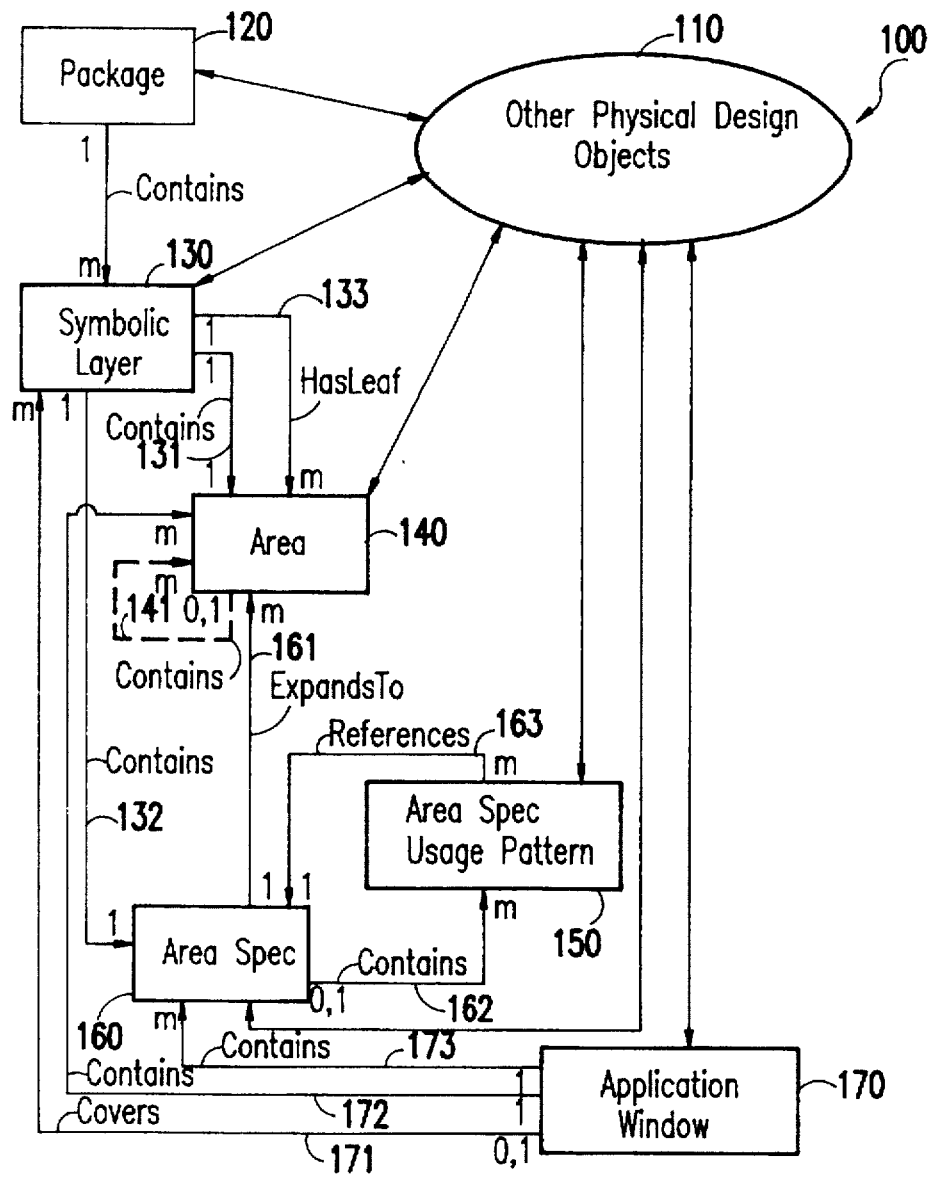
FIG. 3 is an example of a hierarchical image data model in accordance with an aspect of the invention.

Referring now to FIG. 3 with the foregoing as definitions of the more significant features of the data structure architecture in accordance with the invention, an example of a hierarchical data structure 100 in accordance with a preferred form of the invention is shown. Central to the architecture of FIG. 3 is a collective model 110 of physical design objects or a collection thereof which may be objects or systems such as pins, nets and the like associated with the package design 120 which is the highest level of the hierarchy of the data structure. Linkage of the package design 120, symbolic layer entity 130, area entity 140, area spec usage pattern entity 150 (which records how different area specs are combined to form other area specs and their relative locations in a hierarchical fashion), area spec entity 160 and application window entity 170 is depicted by bi-directional arrows to indicate that direct access from any entity and the return of information thereto is provided.

Further in FIG. 3, other arrows indicate the relationships provided between the entities and the package design 120. The numbers adjacent to the ends of the respective arrows indicates the correspondence or cardinality of the particular relationship. Specifically, the package design contains or can be expanded to m symbolic layers 130 at any desired level of abstraction, as discussed above, indicated by arrow 121. (Incidentally, the notation "0, 1" affixed to the origin point of some arrows indicates that the an entity need not exist or be contained by another and that the relationship, likewise need not exist. The condition where an entity might not exist would generally occur at initialization or early stages of the design phase or for areas defined by leaf specifications.) Thus, a selectable one of m symbolic layers 130 provides access through the remainder of the relationships to all entities in the data structure, as follows.

One attribute of the symbolic layer 130 is that it has a defined area which is, by definition, congruent with the area of an area entity 140 which holds all the personalization information (e.g. pattern specifications) for a region which is, in turn defined by an area spec entity 160. Therefore any symbolic area 130 may be said to contain only one area entity 140 and one area spec 160, as indicated by arrows 131 and 132, respectively. Information in an area entity is unique to that area (or considered to be unique since each area of an image which can be defined in a plane is different from any other area which can be defined) and is not shareable. If, in fact, different areas, represented by area entities, have identical contents (although the areas are not the same identically located areas), the definition of the contents may be shared as indicated by arrow 161, connoting the capacity of area spec 160 to expand to m area entities 140. The capability of expansion of an area spec entity to a plurality of area entities effectively provides a compacted expression of at least common attributes of area entities.

This relationship between area entities and area spec entities provides an additional facility during design since changes of design information may require reorganization of the hierarchy. Since shared data is stored only in regard to area spec entities reorganization of the hierarchy is only necessary when the changed information is represented in an area spec entity which is readily detected by having required access thereto from the hierarchically higher area entity. In such a case, this feature of the invention provides a mechanism for transferring the changed data and shared data (or only the changed data as an exception to the shared data) to the area entity merely by following pointers in a manner which will be evident to those skilled in the art in view of this description.

A symbolic layer also represents all lower levels of abstraction in the hierarchy and, just as it contains a single corresponding area, the symbolic layer represents data at all lower levels of abstraction and thus provides a data encapsulation or hiding function to limit the amount of data accessed. However, it is sometimes important to be able to review the design in all detail and the symbolic layer 130 preferably includes the facility, though direct or indirect pointers to all data at the lowest level of abstraction in the design, referred to as the "Hasleaf" relationship depicted by arrow 133 which indicates that the symbolic layer 130 expands or corresponds to m leaves of a hierarchy (e.g. a tree).

The area spec usage pattern entity 150 contains information concerning how different area specs may be combined into another area spec at a higher level of abstraction in a hierarchical fashion and the relative locations thereof. Therefore an area spec 160 at any given level of abstraction may be said to contain m area spec usage pattern entities 150, as indicated by arrow 162. Conversely, access to any one of m particular area spec usage pattern will provide a pointer, in the form of an address, name, table or the like, to a single area spec entity 160 which contains the accessed area spec usage pattern 150, as indicated by arrow 163. It should also be recognized that the relationships implemented by pointers also represent a very much limited search space for updating of the hierarchical data model of the invention when design information is changed.

For simplicity of illustration, the dotted arrow 141 depicts a slave relationship of the area entity 140 to itself which follows the same relationship as the area spec entity 160 bears to itself through the area spec usage pattern entity 150 to indicate the hierarchical relationship to areas (represented by area entities at a lower hierarchical level) which directly correspond to and are thus contained by a given area entity at any given level of abstraction above the leaf level.

In summary at this point of the discussion of FIG. 3, it is seen that the package design 120 contains and thus provides for accessing of any symbolic layer 130 within the design. The symbolic layer provides encapsulation or hiding of all data represented by it and its corresponding area but provides access (e.g. an anchor point for reference) to the details thereof by pointers or the like to the area entity 140 or the area spec entity 160 as well as fast access to the leaf information by expansion. Redundant storage of data is avoided while maintaining unique area definition by the relationship between the area entity 140 and the area spec entity 160; the area spec entity providing for sharing of data defining attributes of the area entity while the area entity data is not shared. (For example, two or more areas could be similar by having certain common characteristics but differing in other characteristics). The common characteristics may then be represented by the area spec entity 160 and shared while the differences are contained in the area entity from which sharing of data is prohibited. Each of the area entity 140 and the area spec entity 160 includes information, preferably in the form of pointers, to indicate the constituent area and area spec entities thereof at lower levels of abstraction, such as is illustrated by the area spec pattern usage entity 150.

In should also be understood from the foregoing, that the data structure such as tree 220 need not exist or be generated for the data structure in accordance with the invention to be utilized or operated upon by an application. Similarly, relationships between entities need not physically exist. For example, special program or data processing functions can be used to achieve the effect of relationships between entities by, for example, simulation of the existence of pointers anywhere in the data structure. Likewise, relationships may be recorded or implicit in (e.g. expressed by) special data structures used in combination with the data structure of FIG. 3 and thus simulate the presence of the relationships illustrated by simulation of the existence of pointers anywhere in the data structure. In this way, relationships may be made either real or virtual and simulations may be made at any level, including the simulation of a fixed data structure such as tree 220.

It is to be understood that, within the package design, any entity at any hierarchical level of the data structure may be directly accessed, interrogated or changed by any application corresponding to Program 1 through Program n of FIG. 1. Each entity provides some degree of data hiding (the symbolic layer entity providing data hiding through encapsulation and the area entity and area spec entity providing data hiding through hierarchical information such as pointers). Thus, the data structure of FIG. 3 thus far described provides limitation of the amount of data accessed to closely follow the requirements of each application program which may be used to process to information at any level. This feature of the invention also effectively avoids the need to build the complete area hierarchy data structure (e.g. a hierarchical area tree) in order to retrieve information therefrom or to store processed information therein. This advantage of the present invention is particularly exploited by the additional feature of the application window entity 170 for providing a spatial restriction within the encapsulation facility, which will now be described.

As an enhancement and perfecting feature of the invention, an application window entity 170 is also preferably provided. In effect, the definition of a window referenced to a geographic area of the image allows the user to select one or more symbolic layers 130 or regions within the symbolic layer(s) which is of particular interest for processing. Thus the application window may be said to "cover" (arrow 171) or expand to all symbolic layers and to "contain" or expand to a corresponding plurality of area entities (arrow 172) or area spec entities (arrow 173). Nevertheless, since the applications window is confined within the image area, its definition allows the restriction of search area through the data structure and simplification of data access as well as association of static areas of the design with particular entities such as floorplan areas for chiplets. The application window entity may also be defined to coincide with an area of a user-defined hierarchy which may, by virtue of the invention, be entirely independent from either a data structure such as a hierarchical area tree or the graphs due to the data hiding capability of the symbolic layers 130.

Figure 4:
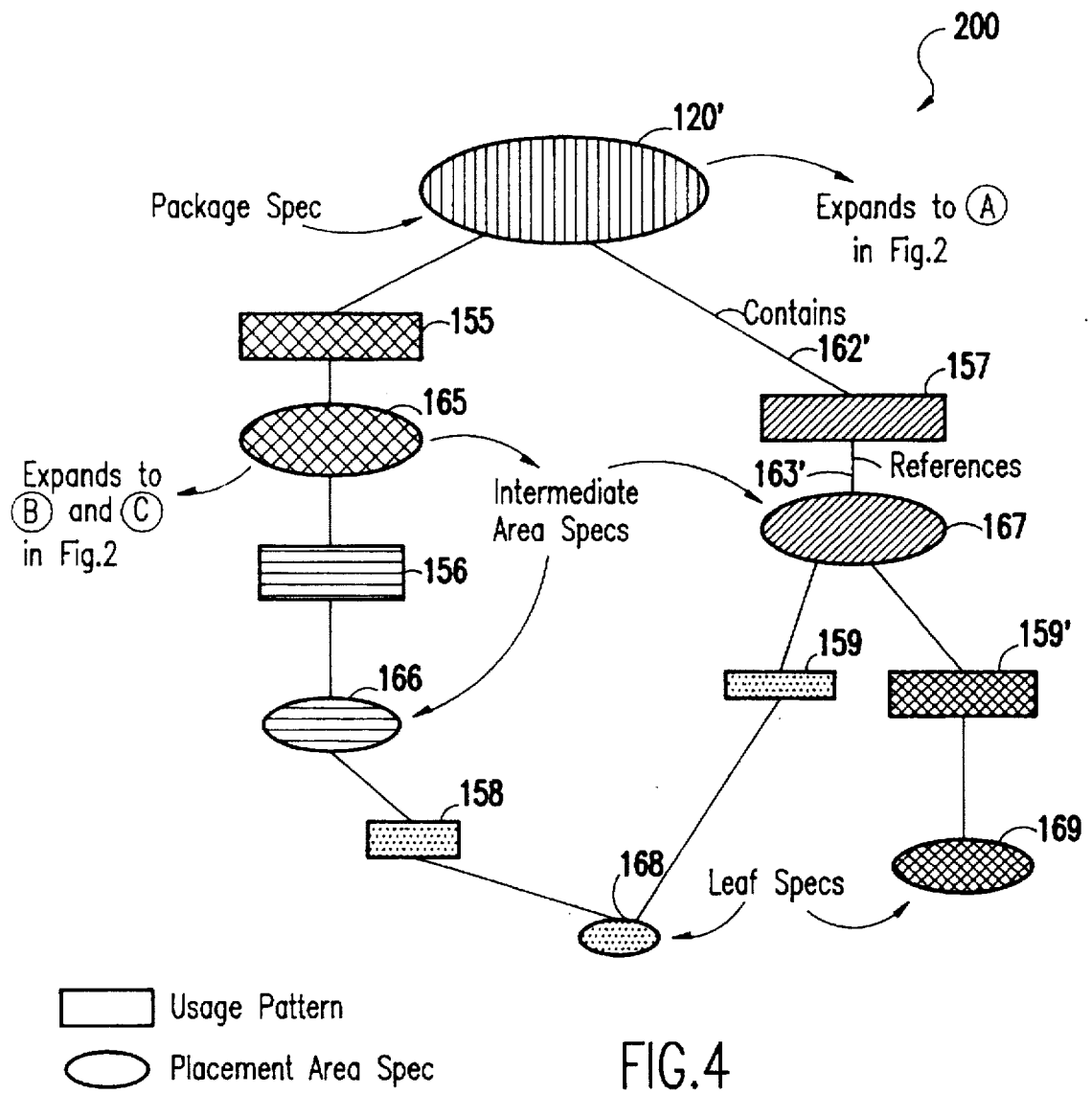
FIG. 4 is a graph diagram representative of an area specification space corresponding to an area entity and an area spec usage pattern entity of FIG. 3.

In view of the above, it is also readily appreciated that the basic entities of the data structure of FIG. 3 are the area entity 140, the area spec entity 160 and the area spec usage pattern entity 150. It must be remembered, however, that the depiction in FIG. 3 represents on a single level of hierarchy or abstraction of the design which supports access to adjacent levels of the hierarchy. The relationships between these entities for access between levels of the hierarchy is illustrated in the diagram of FIG. 4 which is referred to as a graph 200. For purposes of explanation of this graph 200, it is only necessary to consider the hierarchy illustrated in terms of the area spec entity 160 (which is, of course, identified by the area entity 140) and the area spec pattern usage entity 150.

In FIG. 4, the area spec information for content (e.g. placement, defined by an area entity) of a portion or the entirety of a pattern is depicted by a shaded ellipse. The corresponding area spec usage pattern entity containing a pointer to an area spec at a lower hierarchical level is shown as a rectangle shaded correspondingly to the area spec to which it points. Thus, the package specification 120' corresponding to the package 120 of FIG. 3 and provides access, through other entities, to the entire information of the design, also may be said to expand to node A of FIG. 2. As discussed with reference to FIG. 3, the package identification 120 allows access to symbolic layer 130 (as may be further defined by the application window entity 170) which, in turn allows access to the area spec 160 at a given level of the hierarchy. If further detail (which is otherwise hidden) is required, an area spec usage pattern (e.g. 157, corresponding to 150 of FIG. 3) contained (162', corresponding to 162 of FIG. 3) by the area spec 160 is accessed and a pointer reference (163' corresponding to 163 of FIG. 3) to the area spec (e.g. 167) at the next lower level of hierarchy returned. These area specs, of course, correspond or expand to the aggregate information of intermediate nodes (e.g. B and C) of the tree 220 of FIG. 2. Different paths to different information can, of course, be followed (e.g. to 165) to different information since plural area spec usage patterns (e.g. 155, 157) may be contained by each area spec. This process may be repeated (e.g. through 156 to 166, through 158 to 168), as necessary, until the desired level of detail information is obtained.

It should be further noted that since each area spec (e.g. intermediate area specs 165, 166 or 167) at each level of the hierarchy may contain more than one area spec usage pattern, branching may occur as shown through 159' to leaf spec 169. By the same token, the branching may allow the same leaf spec (e.g. 159) to be accessed over different combinations of intermediate area specs.

As indicated above, access to the data structure as illustrated in FIGS. 3 and 4 can be done at any entity to limit the data returned both by category (e.g. by symbolic level or by whether the design is of commonly shared features or unique features of areas) as well as by hiding data at lower hierarchical levels and encapsulation. In this regard, it is to be noted that it does not matter whether or not hidden, encapsulated or otherwise excluded data even exists and thus the data structure supports analyses to be performed at levels of design where much of the data can only be roughly approximated. This, the existence of data can be simulated for analysis even before real data is available. Another advantage accruing from the data structure based on particular entities, relationships and attributes as depicted in FIGS. 3 and 4 is that each application can now access only the data which is required for immediate processing by virtue of the ability to access any entity at any hierarchical level and thence to traverse the data structure hierarchically through limited searches for data.

Since a fixed data structure such as a hierarchical area tree may be derived from the graphs, as will be more evident from the discussion of FIG. 5, below, and the function of hiding of all data other than the data necessary for current processing, it should also be appreciated that data structures such as a hierarchical area tree can be built on demand and incrementally, using the invention. Data can be retrieved without expanding the entire tree structure, reducing both search time and data structure maintenance processing overhead. Further, since data transfer between a fixed data structure, such as a hierarchical area tree, and the graphs and the hierarchical data structure of FIG. 3 upon which the invention operates is not necessary to processing of data within the graphs, fixed data structures may be simulated without need for their existence prior to completion of the design or a particular portion thereof.

It is also to be understood that, due to present usages in the art, much of the data will be available in a flat representation, hierarchically divided by areas (e.g. spatially partitioned) to a given degree of granularity, and that the final design (as well as intermediate stages thereof) will preferably be a fully detailed bit map. Although the nature of the hierarchy in the final data structure is unimportant to the practice of the invention, it can be anticipated that it will at least be hierarchical and that the use of a tree architecture is likely due to the advantages and the many existing algorithms available for the efficient management thereof.

Figure 5:
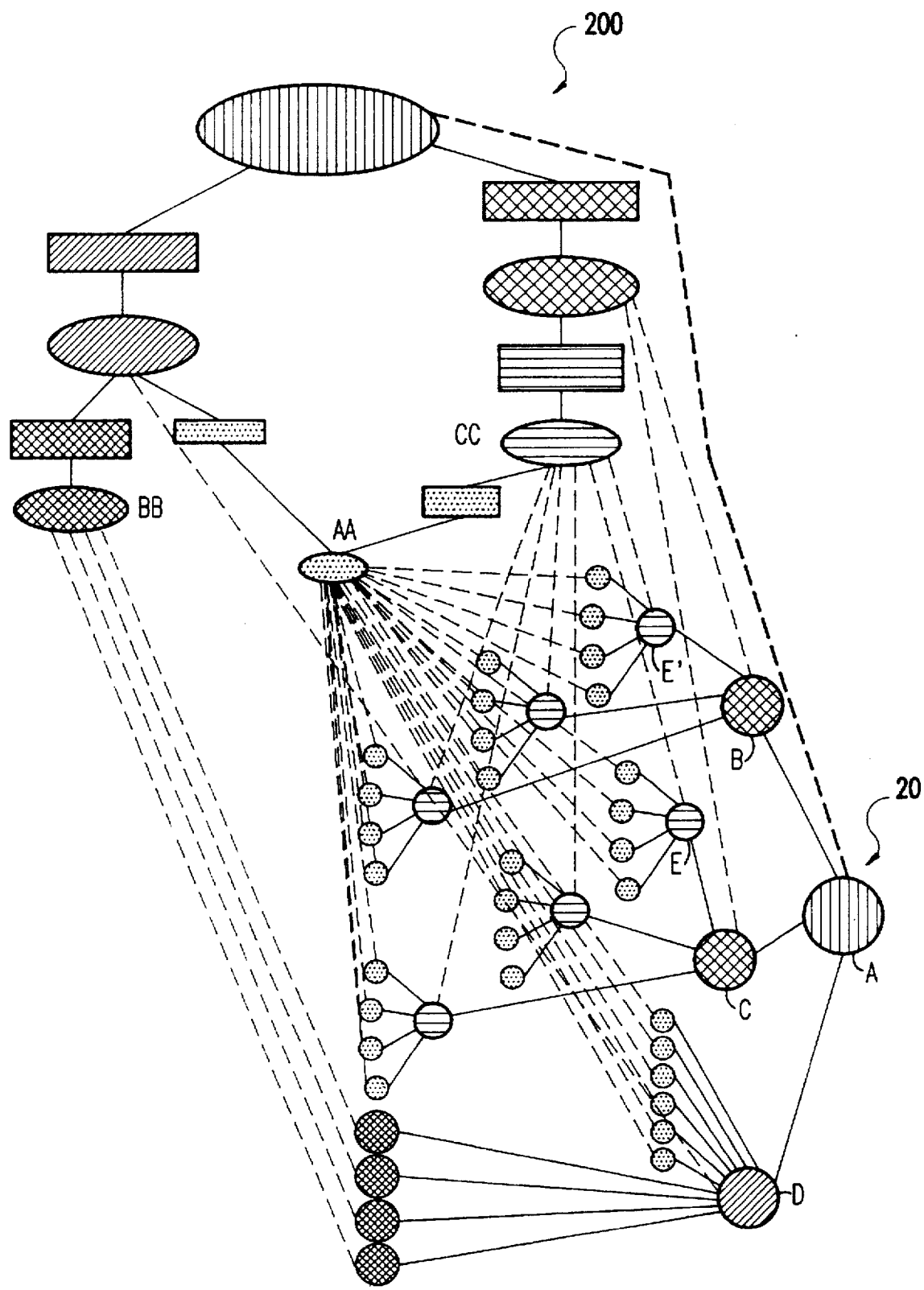
FIG. 5 depicts exemplary expanded hierarchical structures and mapping between data structures in accordance with the invention.

FIG. 5 illustrates the technique of developing correspondence between the hierarchical data model embodied in the data structure of FIGS. 3 and 4 an a generalized, fixed hierarchical data structure such as the tree depicted in FIG. 2. In essence, a pointer or some other identification is provided at the area spec entity to allow mapping of each area spec (but not the area spec usage pattern entities) to nodes of the tree. Two particular advantages accrue from this feature of the present invention which are particularly evident from FIG. 5.

First, the capability of avoiding storage of redundant data is abundantly clear since, for example, leaf area specification AA of the graph 200 of FIG. 4 or FIG. 5 maps onto thirty leaf nodes of the tree 220. Similarly, leaf specification BB corresponds to four nodes of tree 220. This advantage is not limited to leaf nodes as can be seen at area spec CC which maps onto six intermediate nodes of tree 220. It should also be noted that the correspondence of leaf nodes, to which leaf specification AA maps, with the intermediate nodes, to which area spec CC maps, is not necessarily complete or redundant over the leaf specification mapping. Thus differences between nodes D and E can be fully expressed while allowing shared storage of definitions of nodes such as E and E'.

Second, access to the entities of the data structure of FIG. 3 and particularly the areas spec entities at any desired hierarchical level of FIG. 4 effectively allows the application, while forming the graph of FIG. 4, to build an application-specific tree or sub-tree structure. In other words, the mapping of the graph to another hierarchical data structure such as tree 220 of FIGS. 2 and 5 allows the tree structure to be transparent to the application. By the same token, access to the tree is thus made application specific and any searches of data may be conducted within the graph and then mapped to the fixed data structure memory space. Therefore, if plural applications are used to access and manipulate the data, each application will have its own, customized, form of access to data through its own graph while the tree, which none of the applications need know or be specifically adapted to communicate with, provides for transfer of data between the graphs of different applications. This also provides for the effective change of hierarchical differentiation criteria (e.g. the criteria which differentiates nodes at different levels of the hierarchy) from one application to another without the need for conversion or reorganization of the basic tree structure and significantly reduces processing time and overhead. Further, the capacity for defining multiple symbolic layers which may correspond to either shared or independent data structures, plural hierarchical differentiation criteria may be employed for accommodation of the requirements of different applications. It should also be recognized that encapsulation by the symbolic layers 130 in the hierarchical computer model and graph in accordance with the invention also provides encapsulation of data in the fixed data structure such as tree 220 of FIGS. 2 and 5 by virtue of mapping of encapsulated nodes or entities of the computer model to a limited group of nodes of the fixed data structure.

In combination with the applications window entity 170 in which the area of the window can be defined to coincide with hierarchical differentiation criteria such as an informational filter partition in a user defined hierarchy and the capability of accessing a plurality of symbolic layers through the application window, the designer can establish an arbitrary hierarchy in which the hierarchical data structure of FIGS. 3 and 4 is embedded; the correspondence being provided automatically by the invention. For example, the application window can be defined to coincide with a designer defined block which embodies a user-defined hierarchy. Likewise, any symbolic layer, since it also corresponds to an area can also be a user-defined block embodying a user-defined hierarchy. Thus it is seen that the invention can accommodate conversion and correspondence between a plurality of diversely organized data structures while supporting access by plural applications in a manner which is effectively optimum for each application.

Figure 6:
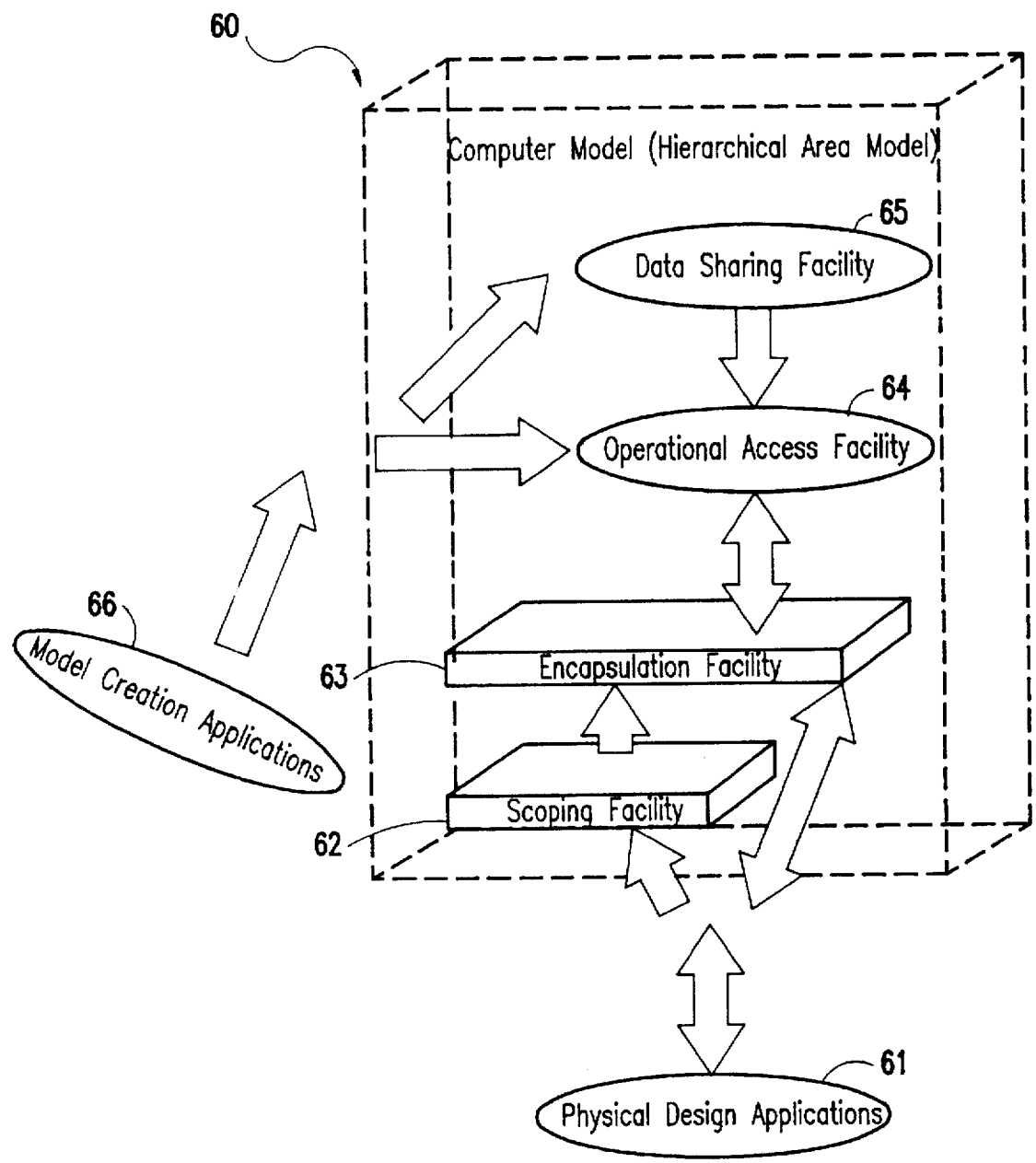
FIG. 6 is an exemplary organization of a computer model in accordance with the invention.

Referring now to FIG. 6, an overview and summary of the functional relationships within the computer model in accordance with the invention will now be discussed. The basic relationship of the applications 61 to the overall computer model 60 is the same as that depicted in FIG. 1. Within the computer model, however, there are two interfaces between the applications and the computer model: a scoping facility 62, achieved as described above with the applications window entity 170, and an encapsulation facility, achieved as described above with the symbolic layer entity 130. As shown, the scoping interface is preferably not an independent interface but controls the symbolic layer entity 130 which provides the encapsulation facility 63 as indicated at 171 of FIG. 3 and discussed above with reference thereto. The encapsulation facility then communicates bi-directionally with the operational access facility provided through the area entity 140, the area spec entity 160 and the area spec usage pattern facility 150 as also discussed above. This operational access facility 64 allows access to any of the entities of FIG. 3 and traversal of the hierarchical model through the slaved relationships defining the contained area and area spec entities by means of pointers or the like. The data sharing facility 65 provides data to the operational access facility 64 by virtue of the mapping of area spec entities to either plural area entities or plural nodes of the hierarchical (e.g. tree) structure 220 of FIGS. 2 and 5. One or more model creation applications 66, such as manual or computer assisted editors, graph derivation algorithms and pattern recognition applications, which are otherwise known in the art and the details of which are not important to the practice of the invention develop data which is placed into the computer model 60 in accordance with the graph of FIG. 4.

Figure 7:
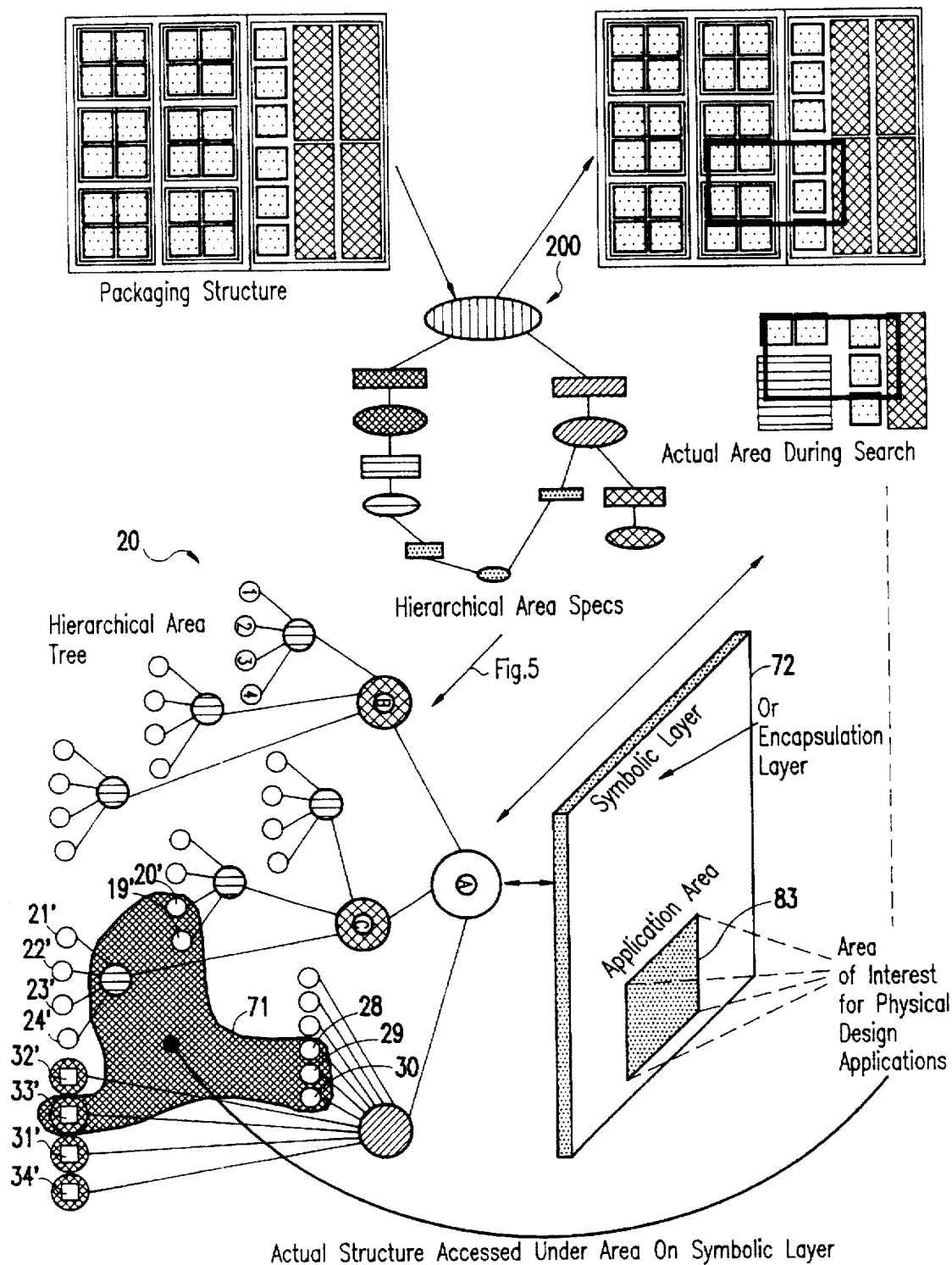
FIGS. 7 and 8 illustrate an example of the operation of the present invention, particularly illustrating the operation of the applications window and interaction with a real or virtual hierarchical data structure through graphs in accordance with the invention.
Figure 8:
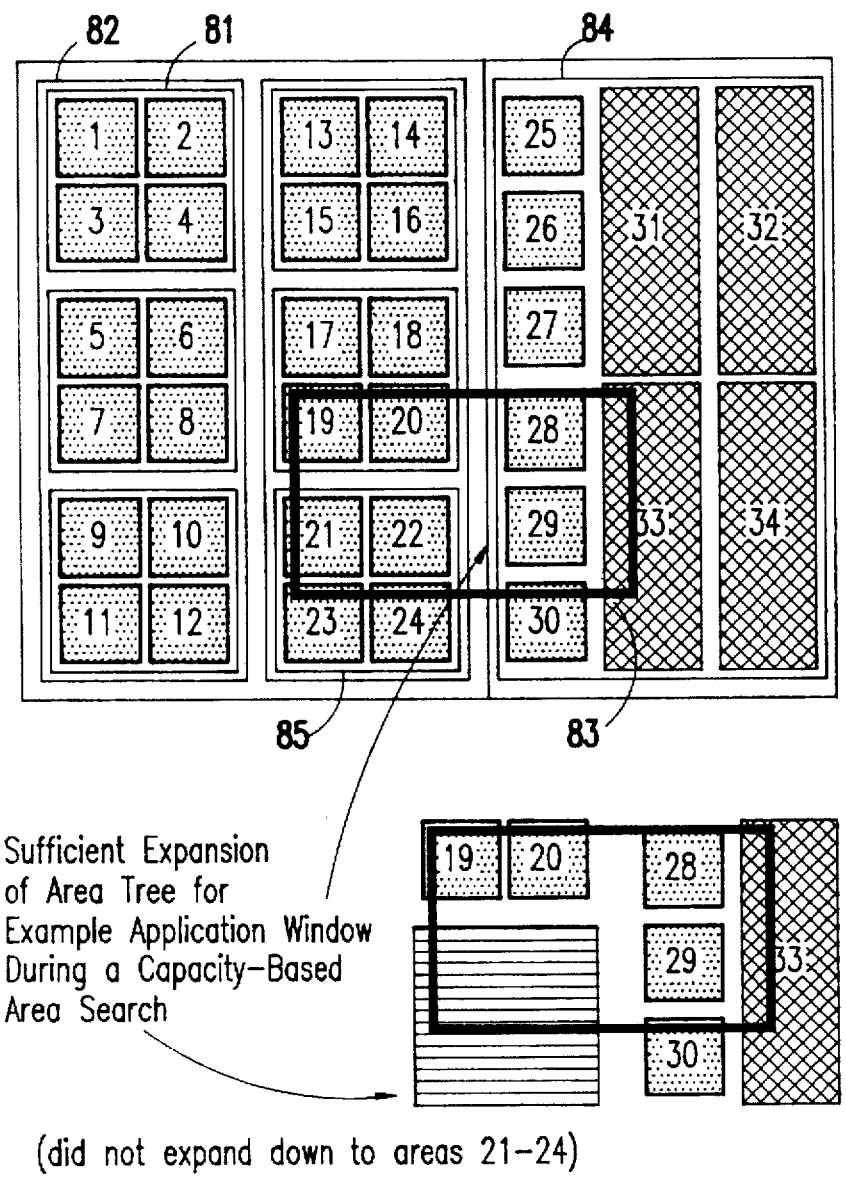

Referring now to FIGS. 7 and 8, the operation of the invention will now be explained. A multi-layer package structure under design is shown at the upper left of FIG. 7 and in expanded form in FIG. 8. Different levels of grouping of areas is indicated by bounding lines and hatching. For example, areas labelled 5, 6, 7 and 8 (which may or may not be identical) are bounded by a square 81 and the area surrounding the areas contains horizontal hatching to indicate that this array of areas may also be described as a single area. Likewise, three of these areas are surrounded by a vertical rectangle 82 and the intervening area marked with dotted hatching for like purpose. Either of areas bounded by line 81 or 82 may be replicated at will and with or without changes from iteration to iteration. For purposes of this example, it is assumed that the particular phase of design in process is the determination of capacity of an area for placement of chips or a particular type of pattern and that a substantial amount of detail data is already present in the graph of the model at several hierarchical levels.

As this model was previously built of such information as transistor, gate element locations or ship slot locations in multi-chip modules, which are built, a priori, groups of devices are then analyzed to form a set of constraints represented in a graph covering a plurality of hierarchical levels. These constraints are now referenced to larger areas and the details thereof may not need to be further considered, as is assumed. Now, if an area is to be analyzed for placement of, for example, chips or patterns 28 and 29, an application window 83 and its corresponding entity 170 is defined by utilization of the scoping mechanism. Once the application window is defined, the details of the interior of areas bounded by areas 82 and 84 are hidden by the hierarchical structure of the graph or the encapsulation of a symbolic layer as indicated in the lower portion of FIG. 8 and areas 28 and 29 are indicated as potential locations for placement of chips or patterns or the like under control of model creation applications 66 of FIG. 6. Information necessary for processing is derived, through the mapping function of FIG. 5, for example through expansion of the tree structure in accordance with the application window. Just as the invention allows the incremental, on demand development of trees and sub-trees, the entire fixed data structure or tree need not be expanded for access to any particular node or group of nodes of the tree or sub-tree. This is depicted in FIG. 7 in which, for example, the application window does not require of expansion of nodes B and C while accessing data which branches from node C in tree 220 which represent a fixed data structure in the same manner as tree 220 in FIGS. 2 and 5.

In the course of this determination, as shown in FIG. 7, areas of one or more of the symbolic layers 130 are selected in accordance with the application window entity 170. These regions of symbolic (or encapsulation layers are defined in terms of area and/or area spec entities represented in graphs and then mapped onto, for example, a hierarchical area tree 220. In effect, the application area 83 within the symbolic or encapsulation layer area 72 is thus mapped onto the hierarchical area tree 220 as a selection of nodes thereof indicated by the bounds of area 71. As described above, it should be noted that some (e.g. 19', 20', 33') but not all (e.g. 21'-24') leaf nodes are included in this selection indicating hiding or lack of need for expansion of area 85.

From the foregoing, it is seen that the invention embodying a graph data structure and including entities having particular relationships therebetween and mappable onto another hierarchical structure provides a powerful and flexible tool of access to portions of a computer model, permitting data hiding and minimization of search and manipulation of, for example, a hierarchical area tree structure expressing the design. The invention thus allows analysis of designs at early stages where only rough approximations of data are available (by simulation of any entity) as well as the mixing of real (e.g. known, a priori), estimated and derived data while hiding non-essential data and provides transparency of the hierarchical area data structure, permitting each application to have customized access thereto.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. An information model comprising
   a first data structure containing, at respective nodes, descriptions of physical or abstracted physical attributes of a spatially partitioned physical structure, said descriptions of physical or abstracted physical attributes being partitioned hierarchically,
   a second data structure containing, at respective nodes, a nested, compacted, representation of each said hierarchical partition of said physical or abstracted physical attributes and specifications of each said hierarchical partition of said physical or abstracted physical attributes, and
   an interface means for encapsulating said first and second data structures from inquiring applications
   each said node of said first data structure mapping to a node of said second data structure and each node of said second data structure mapping to at least one node at a single hierarchical level of said first data structure.

2. An information model as recited in claim 1, wherein said respective nodes of said second data structures are related in a hierarchy.

3. An information model as recited in claim 1, wherein said encapsulation means further includes means for accessing, interrogating or changing at least one selected node of one of said first and second data structures.

4. An information model as recited in claim 1, further including scoping means for defining a spatial restriction of said physical structure within said encapsulation means and said first and second data structures encapsulated therein.

5. An information model as recited in claim 4, wherein said encapsulation means further includes means for accessing, interrogating or changing at least one selected node of one of said first and second data structures.

6. An information model as recited in claim 1, further including
   means for specifying or altering said descriptions of physical or abstracted physical attributes of a spatially partitioned physical structure and
   means for altering said descriptions at hierarchically higher nodes of said first data structure corresponding to said specification or alteration of said descriptions.

7. An information model as recited in claim 6, further including
   means for simulating a specification or alteration of said descriptions of physical or abstracted physical attributes at a lower level of said hierarchical partition of said first data structure at a higher level of said first data structure.

8. An information model as recited in claim 7, wherein said means for simulating a specification or alteration of said descriptions includes at least one of
   data processing means to produce the effect of relationships between entities, and a data structure to record or simulate existence of a relationship between entities.

9. A method of performing an operation on data representing physical or abstracted physical attributes of an object including the steps of
   specifying said data in a first data structure in a hierarchical form,
   storing specification data in nodes of a second data structure, said second data structure being hierarchically partitioned, said specification data at a node of said second data structure corresponding to said data stored in at least one node at a single hierarchical level of said first data structure,
   mapping nodes of said first data structure to nodes of said second data structure, and
   forming an encapsulating layer which interfaces with said first and second data structures for accessing, interrogating and altering said first and second data structures.

10. A method as recited in claim 9, wherein said encapsulation step includes the further step of
    isolating a partition of said encapsulation layer.

11. A method as recited in claim 10, wherein said partition is a spatial partition corresponding to a portion of said object.

12. A method as recited in claim 11, wherein said spatial filter partition is defined to coincide with hierarchical differentiation criteria of a user-defined hierarchy.

13. A method as recited in claim 10, wherein said partition is a informational filter partition.

14. A method as recited in claim 13, wherein said informational filter partition is defined to coincide with hierarchical differentiation criteria of a user-defined hierarchy.

* * * * *